United States Patent [19]

Liaw et al.

[11] Patent Number: 5,721,146
[45] Date of Patent: Feb. 24, 1998

[54] METHOD OF FORMING BURIED CONTACT ARCHITECTURE WITHIN A TRENCH

[75] Inventors: Jhon-Jhy Liaw, Taipei; Jin-Yuan Lee, Hsin-chu; Hung-Chi Hsiao, Miao-Li, all of Taiwan

[73] Assignee: Taiwan Semiconductor Manufacturing Company Ltd, Hsin-Chu, Taiwan

[21] Appl. No.: 638,708

[22] Filed: Apr. 29, 1996

[51] Int. Cl.$^6$ ............................................. H01L 21/266
[52] U.S. Cl. .................. 437/26; 437/35; 437/191; 437/203
[58] Field of Search .................. 437/26, 35, 38, 437/56, 191, 203; 148/DIG. 20

[56] References Cited

U.S. PATENT DOCUMENTS

| | | | |
|---|---|---|---|
| 5,126,285 | 6/1992 | Kosa et al. | 437/191 |
| 5,208,168 | 5/1993 | Parrillo et al. | 437/26 |
| 5,298,782 | 3/1994 | Sundaresan | 437/191 |
| 5,378,641 | 1/1995 | Cheffings | 437/35 |
| 5,550,085 | 8/1996 | Liu | 437/203 |

OTHER PUBLICATIONS

S. Wolf, "Silicon Processing For The VLSI Era–Volz", 1990 Lattice Press, Sunset Beach, CA, pp. 160–162, 577–580.

Primary Examiner—Chandra Chaudhari
Attorney, Agent, or Firm—George O. Saile; Stephen B. Ackerman

[57] ABSTRACT

An method for the fabrication of an improved polysilicon buried contact is described. The contact is formed within a trench etched into the silicon substrate. The effective area of the contact is thereby increased over the conventional planar buried contact by an amount equal to the area of the trench walls. For sub-micron sized buried contacts and trenches 1000 to 3000 Angstroms deep this area can be twice that of the conventional planar buried contact. Contacts formed in this fashion are particularly beneficial in the manufacture of static-random-access memory devices(SRAMs) through their application with local-interconnects. They afford a lower contact resistance, manifested by the greater effective contact area, as well as a much reduced risk of open or high resistive contacts due to photomask mis-alignment. The presence of the trench also results in a higher junction capacitance which affords a reduction in soft-error-rates, a notable concern for memory devices.

22 Claims, 4 Drawing Sheets

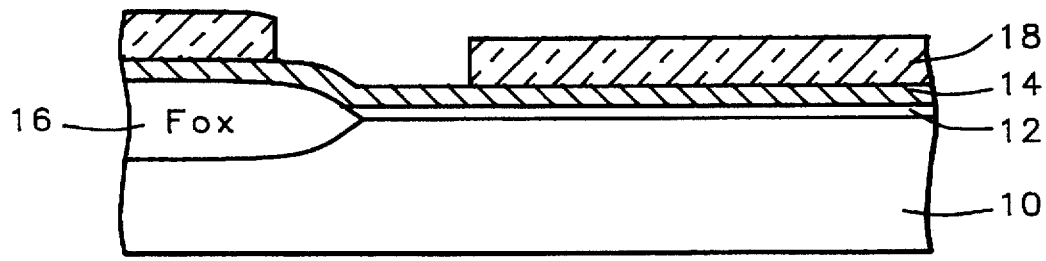
FIG. 1A – Prior Art
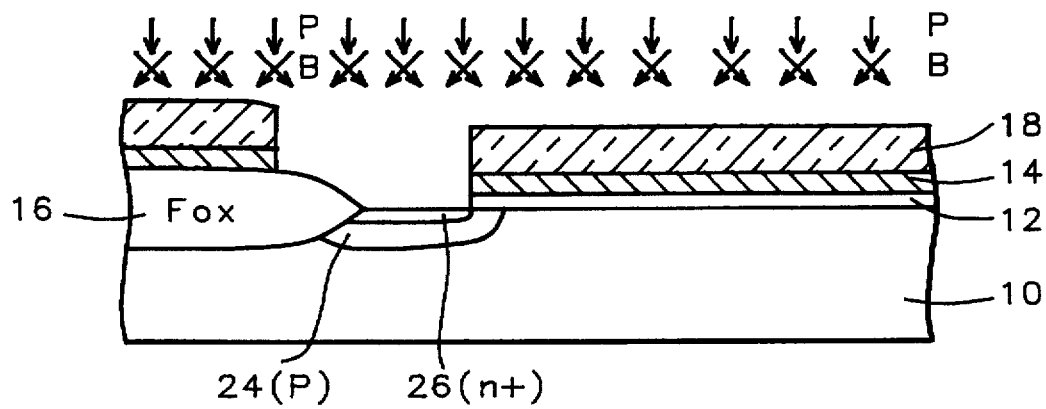
FIG. 1B – Prior Art
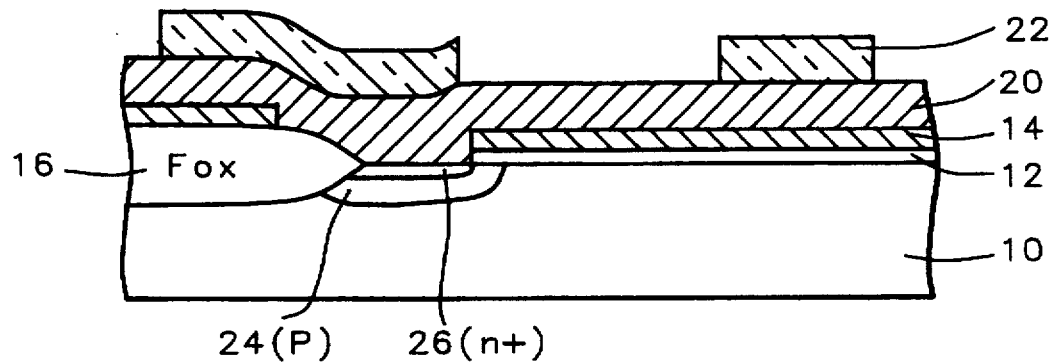
FIG. 1C – Prior Art

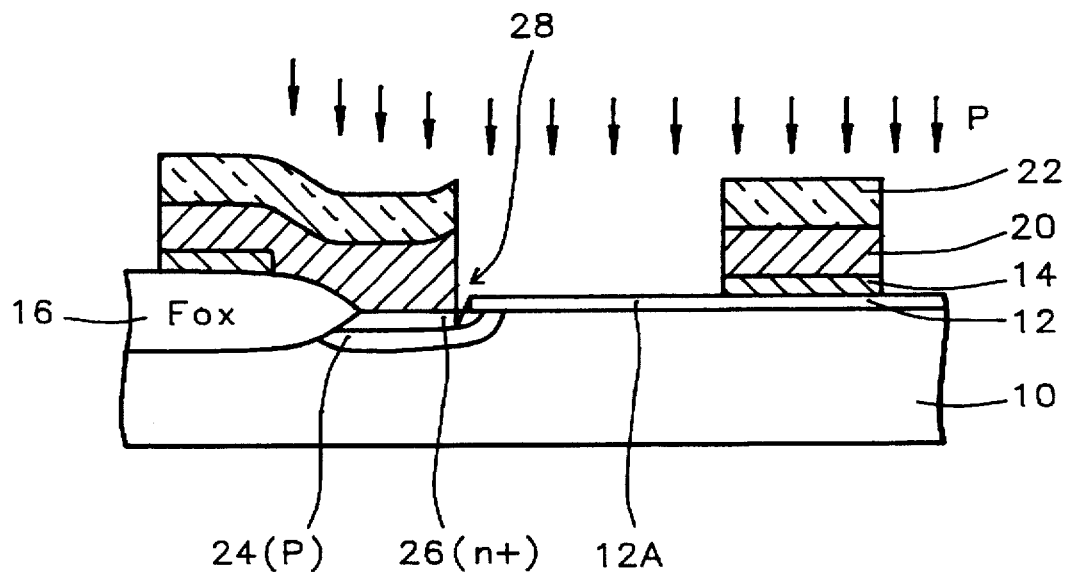
*FIG. 1D - Prior Art*
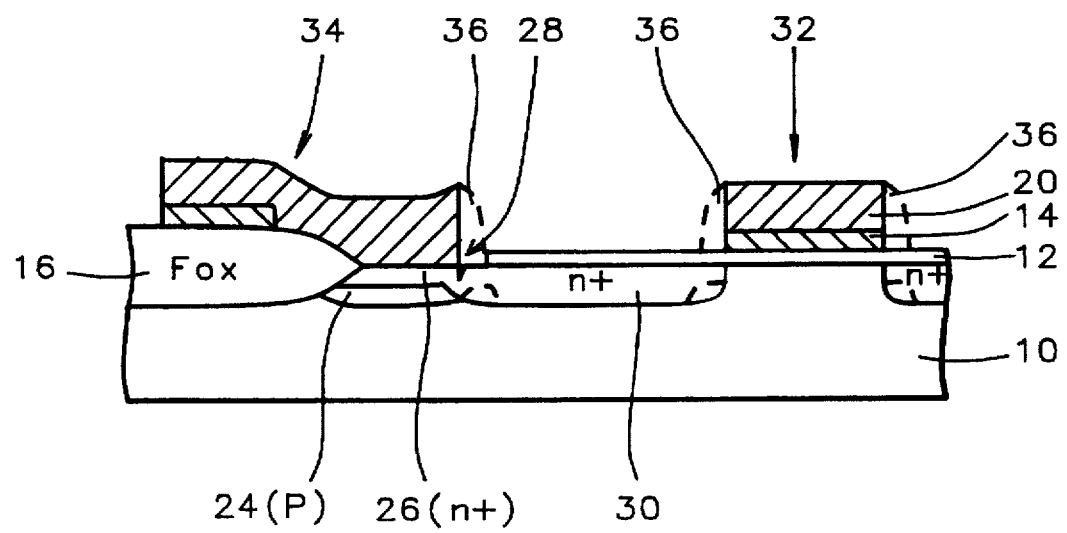
*FIG. 1E - Prior Art*

METHOD OF FORMING BURIED CONTACT ARCHITECTURE WITHIN A TRENCH

BACKGROUND OF THE INVENTION (1) Field of the Invention

The invention relates to processes for the manufacture of semiconductor devices and more particularly to processes for forming buried contacts.

(2) Description of prior art

Very large scale integrated circuit(VLSI) technology comprises the formation of isolated semiconductor devices within the surface of silicon wafers and interconnecting these devices with wiring layers above the surface. This interconnection system usually consists of two or more levels of interconnection metallurgy, separated by insulation layers. The first level of interconnection is used to define small fundamental circuits, for example, a simple TTL gate comprised of two bi-polar transistors and two resistors. The basic CMOS inverter requires that the gates on the NMOS (n-channel MOS field-effect-transistor) and the PMOS(p-channel MOS field-effect-transistor) devices be connected together. Memory cells, in particular, require several such local interconnections.

The progressive need for higher densities of memory cells has fueled the development of that segment of interconnection technology which has become known as "Local Interconnects"(LI). The success and extensive use of polysilicon as the MOSFET gate material has played a dominant role in this development and, in the sub-micron technology of today, it has become the most important material used for forming these connections. Previous technology used an aluminum alloy for short wiring runs such as from a gate electrode to an adjacent drain. These links were referred to as butted contacts because the contact window was opened to expose both the polysilicon gate and the adjacent drain. With the buried contact, direct contact is made between polysilicon and the substrate. When in-situ doped polysilicon is deposited over a thin gate oxide layer to form a transistor gate it can simultaneously by deposited into an opening in the gate oxide over a nearby drain diffusion, for example, to make a contact between the gate and the drain region. Subsequent annealing then forms a stable ohmic contact to the diffused region.

Several major designs for Static Random Access Memory (SRAM) arrays have been developed using both NMOS and CMOS technology. All make abundant use of local interconnects with buried contacts. The earliest, NMOS SRAMs, contained six n-channel MOSFETs(MOS field-effect-transistor) per cell. Three local interconnects using buried contacts were used in this cell to connect polysilicon gates to substrate diffusions.

Other SRAM designs, such as full CMOS SRAMS and poly-load SRAMs, rely upon local interconnects made with buried contacts. These interconnects contribute to a reduction in cell size, allowing an increase in memory density.

A conventional sequence of steps for forming a gate-to-drain LI using a polysilicon buried contact is shown in FIG.2. Referring first to FIG.1A, a p-type silicon wafer 10 is provided having a field isolation region(FOX) 16 and a gate oxide 12. A thin layer of about 450 to 550 Angstroms of un-doped polysilicon 14 is deposited using Low-Pressure-Chemical-Vapor-Deposition(LPCVD). Photoresist 18 is applied and openings for the buried contacts are patterned in the resist. Using Reactive-Ion-Etching(RIE) with chlorine, the polysilicon is etched to the underlying the gate oxide which is then removed with dilute hydrofluoric acid or by RIE with tetrafluoromethane($CF_4$).

Referring next to FIG.1B, the wafer is first implanted with boron using the Large-Angle-Tilt-Implanted-Punchthrough-Stopper(LATIPS) process. The implanted boron 24 prevents punchthrough below the channel region and also acts as a channel-stop under the field isolation 16. Next a normal implant of phosphorous of about $1\times10^{15}$ to $3\times10^{15}$ atoms/$cm^2$ forms the region 26 within the silicon where the LI contact is to be made. A second layer of polysilicon 20 is then deposited by CVD (FIG. C). This layer is in-situ doped with phosphorous and will form the body of the LI as well as the gate electrode for the device. A second layer of photoresist 22 defines the LI as well as the gate electrode.

Again, using RIE with chlorine, the excess polysilicon is etched away forming the completed LI 34 and the gate electrode 32(FIG.1D–E). Connection of the LI 34 to the gate shown 32, or to another gate can occur over the field oxide region 16 where additional connections may also be formed. In FIGS.1D and 1E there is shown the effect of a slight mis-alignment of the photomask which defines the LIs and gates with respect to the photomask which defines the buried contact opening. When the polysilicon is etched back, the subjacent silicon oxide layer 12A acts as an etch stop for the chlorine RIE. A mask mis-alignment can present a small portion of exposed silicon where the oxide had been previously etched away to expose the buried contact. The result is a penetration of the silicon surface 28 during the second polysilicon 20 etch. This penetration has the potential of causing an open or highly resistive contact, especially in shallow implanted devices. Note: if an oxide spacer 36 is used to create lightly-doped-drain(LDD) regions for the transistor, the region at the notch 28 will be even more jeopardized by the lack of dopant at the defect.(The LDD profile is denoted by the dashed portion in FIG. 1E).

The source and drain regions 30 as well as the polysilicon gates 32 are next implanted with phosphorous in the usual manner to complete the formation the self-aligned polysilicon-gate MOSFETS. A subsequent thermal anneal fuses the contacts and activates the implanted dopants.

FIG. 1E shows the complete implanted drain region which consists of the implants 26 and 30. The actual contact area between the polysilicon LI 34 and the implanted region is smaller than the overall n+ region in the silicon. As device geometries shrink, this area becomes so small that contact resistances increase to unacceptable levels. Additionally, the hazards of mis-alignment become more serious with shallow junction active areas.

This invention describes a method whereby the contact area of the LI to the silicon wafer can be substantially increased without sacrificing planar device design area. Additionally, mis-alignment is made conspicuously more tolerable.

SUMMARY OF THE INVENTION

It is therefore an object of this invention to provide an improved buried contact design which has a higher contact area than the planar wafer design area which it consumes. It is a further object of this invention to provide a manufacturing method for forming said improved buried contact. In accordance with these objects the buried contact design achieves its increased contact area by being situated within a trench in the substrate silicon and thereby its area is increased by an amount equal to the area of the walls of said trench. The trench is formed by reactive-ion-etching within a portion of the active area of a semiconductor device located adjacent to a field oxide region. A large-angle-tilt ion implant introduces an anti-punchthrough region beneath the trench. In-situ doped polysilicon is then deposited into the trench to form the contact. The polysilicon extends over the field oxide region where it makes connection to other circuit elements. When used in conjunction with self-aligned gate MOSFETs the buried contacts and the gates are deposited simultaneously. No additional photomasking steps are required. The walls of the trench provide a significant augmentation to the contact area, especially when the planar area of the contact opening is in the sub-micron range. An additional improvement over prior art offered by this invention is an abatement of the effect of etch penetration caused by photomask mis-alignment.

BRIEF DESCRIPTION OF THE DRAWINGS

FIG. 1(A–E) are cross sections of processing steps in a prior art process for forming a polysilicon buried contact.

DESCRIPTION OF THE PREFERRED EMBODIMENTS

Figure 2A:
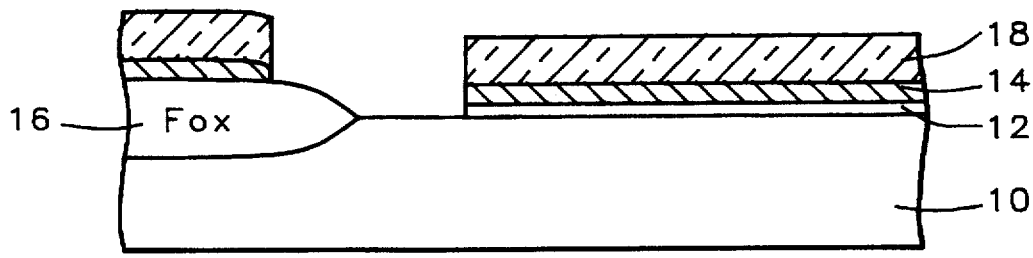
FIG. 2(A–E) are cross sections of the processing steps for forming a polysilicon buried contact as taught by this invention.

Accordingly, a p-doped <100> oriented monocrystalline silicon wafer substrate is provided. The wafer is processed using the conventional procedure described above, to the point where the buried contact anti-punchthrough boron implant would normally be applied(FIG. 1B). Referring now to FIG. 2A, there is shown the cross section after the polysilicon and the gate oxide have been etched to expose the silicon surface in the buried contact opening.

Figure 2B:
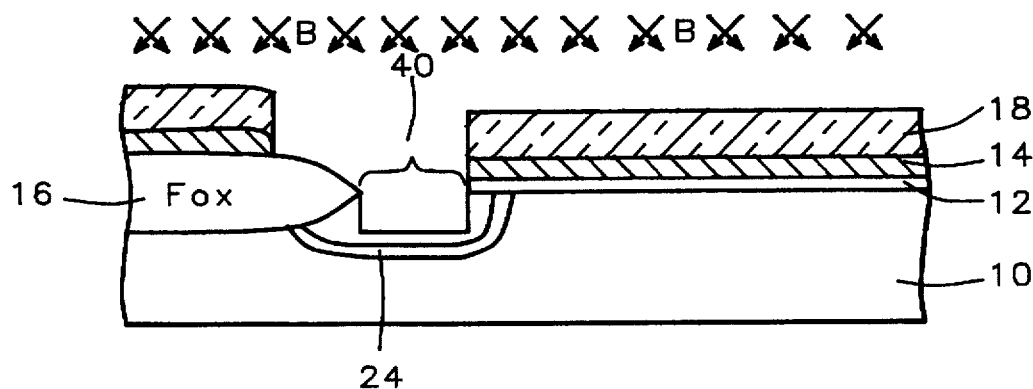

The wafer is returned to the RIE tool and, again using chlorine, a depression or trench 40(FIG.2B) is etched into the wafer surface in the buried contact opening. The depth of the trench is between 1,000 and 3,000 Angstroms. The etch conditions for the RIE are set to provide a trench with vertical walls with slight rounding of the lower corners.

As a further process simplification, the etching of the polysilicon 14 and the trench 40 may be carried out within the same RIE tool under the same pumpdown by merely altering the reactant gas mixture and the RIE conditions to remove the thin gate oxide layer 12. Here, Argon/chlorine or $SF_6$/chlorine is used to etch the polysilicon 14 to the gate oxide surface. The reactant gas is next changed to tetrafluoromethane($CF_4$) to etch the oxide layer 12. Finally, the chlorine plasma is returned to complete the forming of the trench 40.

The anti-punchthrough ion-implant is next accomplished into the trench using large-angle-tilt(LAT) implantation to form the anti-punchthrough(APT) barrier 24. The APT implant consists of boron at a dose of $1\times10^{13}$ to $7\times10^{13}$ atoms/$cm^2$ at energies ranging from 60 to 180 keV. The boron is deployed at a depth of between 2,000 to 4,500 Angstroms below the silicon surface. The preferred wafer tilt angle is between 20° and 45°.

Figure 2C:
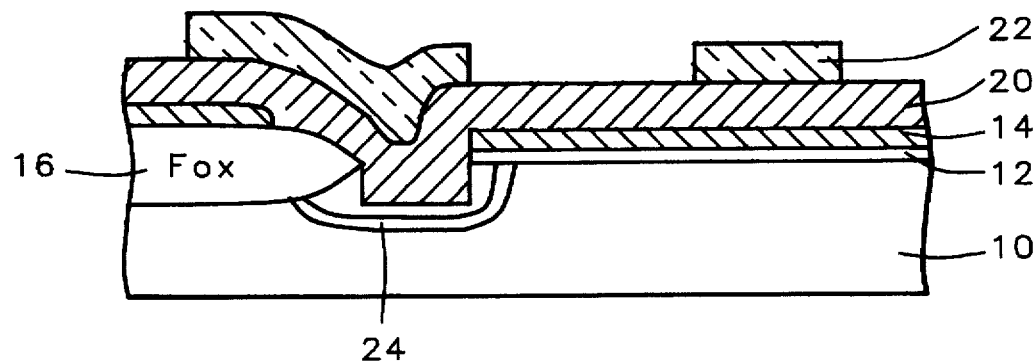

After removal of the residual photoresist 18.a second layer of polysilicon 20 is deposited using LPCVD at a temperature of 400° C. to 700° C. FIG.2C). This layer is in-situ doped with phosphorous and will form the body of the LI as well as the gate electrode for the device. A second layer of photoresist 22 defines the LI as well as the gate electrode.

Figure 2D:
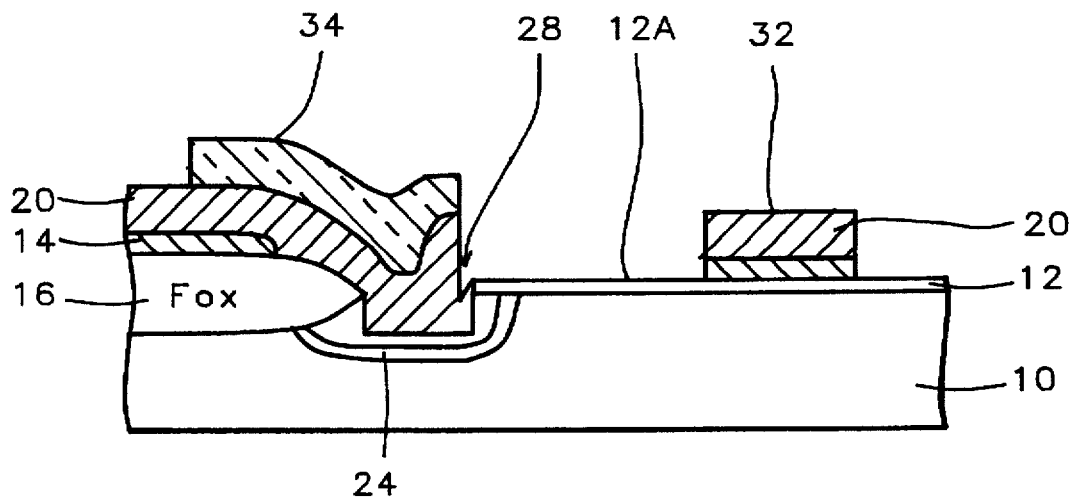

Again, using RIE with chlorine, the excess polysilicon is etched away forming the completed LI 34 and the gate structure 32 (FIG.2D). The exposed silicon oxide layer 12A is then dip etched away as before. In this figure, we again show the effect of a slight mis-alignment of the photomask which defined the LI 34 and gate 32 with respect to the photomask which defined the buried contact opening. When the polysilicon 20 is etched back to the silicon oxide 12, the mis-alignment causes a small portion of silicon to be exposed, resulting in a penetration 28 of the RIE into the wafer surface.

Figure 2E:
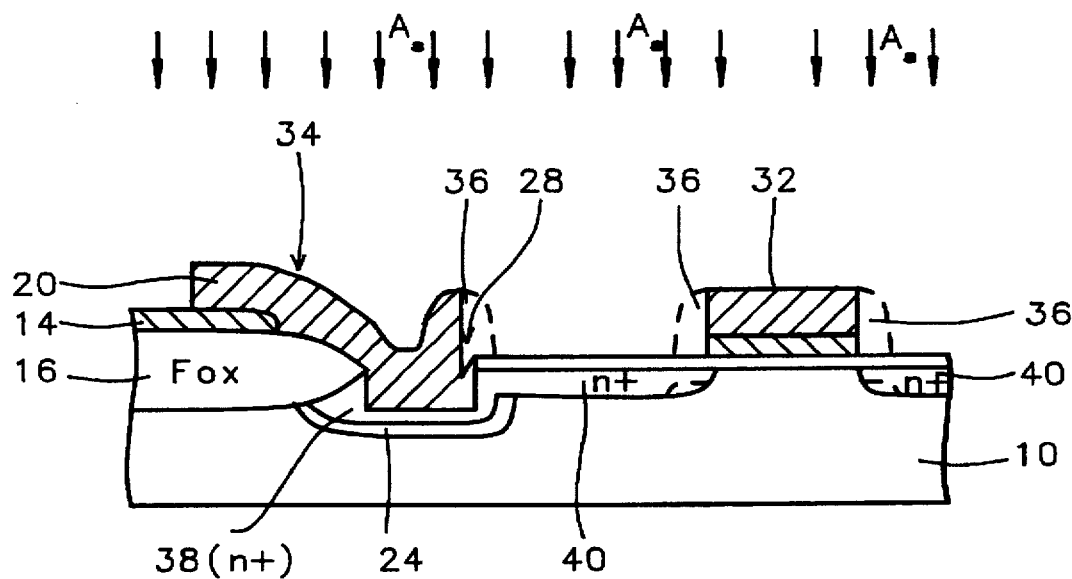

Referring to FIG.2E, the source and drain regions 40 as well as the polysilicon gates 32 and LIs 34 are next implanted with arsenic in the customary manner to complete the formation the self-aligned-polysilicon-gate MOSFETS.

A thermal anneal serves to fuse the contact, drive in dopant 38 from the polysilicon 34, and activate the implanted dopants 40. Any small flaw 28, caused by mask mis-alignment is now well above the floor of the n+ region 38/40 due to the presence of the trench and poses a greatly diminished risk of contact failure. Also, detrimental effects of the diminished doping at the defect 28 caused by the sidewall spacer 36 is lessened by the presence of the heavily doped trench sidewall below the defect 28. The LDD profile is denoted by the dashed lines in the source/drain regions 40.

The formation of the gates and LIs are now complete and the wafer continues further processing to incorporate the remaining interconnection metallization. A layer of Interlevel Dielectric(ILD) is applied and metal connections are made to the polysilicon LIs and gates through openings in the ILD as called for by the circuit design.

Table I gives examples of the gain in contact area by utilizing the trench buried contact of this invention compared to the conventional planar buried contact. It can be observed that significant contact area increases are possible, particularly for the smaller geometries.

TABLE I

Comparison of contact areas for Planar and Trenched Buried Contacts

| Contact Opening (µm) | Trench Depth (Å) | Contact Area (µm²) | Percent Increase |
|---|---|---|---|
| 0.5 × 0.5 | 0 | 0.25 | Planar |
|  | 1,000 | 0.45 | 80 |
|  | 2,000 | 0.65 | 160 |
|  | 3,000 | 0.85 | 240 |
| 1.0 × 1.0 | 0 | 1.0 | Planar |
|  | 1,000 | 1.4 | 40 |
|  | 2,000 | 1.8 | 80 |
|  | 3,000 | 2.2 | 120 |
| 2.0 × 2.0 | 0 | 4.0 | Planar |
|  | 1,000 | 4.8 | 20 |
|  | 2,000 | 5.6 | 40 |
|  | 3,000 | 6.4 | 60 |

The embodiment of FIG.3 uses a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated. Such situations encountered in the twin-well CMOS technology.

Correspondingly, whereas the embodiment uses arsenic or phosphorous as the implant for the source and drain implants in a p-type well, boron would be used as the corresponding implant in an n-type well.

While the invention has been particularly shown and described with reference to the preferred embodiments thereof, it will be understood by those skilled in the art that various changes in form and details may be made without departing from the spirit and scope of the invention.

What is claimed is:

1. A method of forming a buried contact to a silicon semiconductor device having a high effective contact area, low contact resistance, and high junction capacitance comprising:

providing a semiconductor wafer having field isolation regions within its surface which surround areas of silicon wherein semiconductor devices are to be formed; forming a silicon oxide layer over said areas of silicon;

forming a first layer of polysilicon over said semiconductor wafer;

depositing a first layer of photoresist over said first layer of polysilicon;

patterning said layer of photoresist to define buried contact regions;

etching said first layer of polysilicon with a unidirectional dry etching technique to provide vertical walled buried contact openings in said first layer of polysilicon, thereby exposing said silicon oxide layer;

removing said silicon oxide layer within said buried contact openings thereby exposing subjacent silicon; etching said subjacent silicon with a unidirectional dry etching technique to form a trench;

performing an oblique ion implant of dopant atoms; forming a second layer of polysilicon over said semiconductor wafer;

depositing a second layer of photoresist over said second layer of polysilicon;

patterning said second layer of photoresist to define local interconnect structures and gate structures for semiconductor devices;

etching said second layer of polysilicon with a unidirectional dry etching technique to provide vertical walled openings in said second layer of polysilicon, exposing said silicon oxide layer; implanting a second dose of dopant atoms; annealing said semiconductor wafer; depositing a layer of glass over said semiconductor wafer; and continuing interconnection processing to produce completed integrated circuit chips.

2. The method of claim 1 wherein the thickness of said silicon oxide layer is between about 70 Angstroms and 200 Angstroms.

3. The method of claim 1 wherein the thickness of said first layer of polysilicon is between about 300 and 700 Angstroms thick.

4. The method of claim 1 wherein said first layer of polysilicon is un-doped.

5. The method of claim 1 wherein the unidirectional dry etching technique for etching said first layer of polysilicon and said second layer of polysilicon is reactive-ion-etching using chlorine or $SF_6$ with chlorine and conditions conducive to provide vertical sidewalls, a high silicon-to-photoresist etch rate ratio, and precise end-point detection.

6. The method of claim 5 wherein the method of end-point detection is optical-emission-spectroscopy using the magnitude of the silicon signal as an indicator of endpoint.

7. The method of claim 1 wherein the unidirectional etching technique for etching said subjacent silicon to form said trench is reactive-ion-etching using chlorine or $SF_6$ with chlorine and conditions conducive to provide vertical sidewalls and a high silicon-to-photoresist etch rate ratio.

8. The method of claim 1 wherein the silicon oxide layer is removed by dip etching with dilute hydrofluoric acid.

9. The method of claim 1 wherein the silicon oxide layer is removed by reactive-ion-etching with $CF_4$.

10. The method of claim 1 wherein the first layer of polysilicon, the silicon oxide layer and the subjacent silicon are etched sequentially by reactive-ion-etching, within a single pump-down, using first a chlorine containing gas for said first layer of polysilicon, followed by a $CF_4$ containing gas for removing said silicon oxide layer, followed by a chlorine containing gas to etch said subjacent silicon to form said trench.

11. The method of claim 1 wherein the depth of the trench is between about 1,000 and 3,000 Angstroms.

12. The method of claim 1 wherein said areas of silicon wherein semiconductor devices are to be formed are p-type.

13. The method of claim 12 wherein the oblique ion implant of dopant atoms consists of boron atoms.

14. The method of claim 12 wherein the oblique implant of dopant atoms is performed at energies of between about 60 and 100 keV and to a dosage of between about $1 \times 10^{13}$ and $7 \times 10^{13}$ atoms/cm$^2$.

15. The method of claim 1 wherein the oblique ion implant of dopant atoms is performed at an angle in the range of about 20° to 45° to the normal of the wafer while the wafer is rotating.

16. The method of claim 1 wherein the thickness of said second layer of polysilicon is between about 500 and 2,000 Angstroms.

17. The method of claim 1 wherein the second layer of polysilicon is deposited by LPCVD at a temperature of between about 400° C. and 700° C.

18. The method of claim 12 wherein said second layer of polysilicon is in-situ doped with phosphorous to a concentration of between about $1 \times 10^{20}$ and $1 \times 10^{21}$ atoms/cm$^3$.

19. The method of claim 1 wherein said areas of silicon wherein semiconductor devices are to be formed are n-type.

20. The method of claim 19 wherein the oblique ion implant of dopant atoms consists of phosphorous atoms.

21. The method of claim 19 wherein the oblique implant of dopant atoms is performed at energies of between about 150 and 220 keV and to a dosage of between about $1 \times 10^{13}$ and $7 \times 10^{13}$ atoms/cm$^2$.

22. The method of claim 19 wherein said second layer of polysilicon is in-situ doped with boron to a concentration of between about $1 \times 10^{20}$ and $1 \times 10^{21}$ atoms/cm$^3$.

* * * * *